United States Patent [19]

Welty et al.

[11] Patent Number: 4,648,103
[45] Date of Patent: Mar. 3, 1987

[54] FLIP-FLOP HAVING DIVIDE INHIBIT CIRCUITRY TO CHANGE DIVIDE RATIO

[75] Inventors: Dennis L. Welty, Mesa; W. David Pace, Tempe, both of Ariz.

[73] Assignee: Motorola, Inc., Schaumburg, Ill.

[21] Appl. No.: 656,310

[22] Filed: Oct. 1, 1984

[51] Int. Cl.⁴ ............................................. H03K 19/08
[52] U.S. Cl. ........................................ 377/52; 377/47; 307/271; 307/276
[58] Field of Search ................... 377/47, 48, 52, 116, 377/118; 307/271, 289, 291, 272 R, 272 A, 247 R

[56] References Cited

U.S. PATENT DOCUMENTS 3,605,025 9/1971 Concord et al. .................. 377/48
3,753,014 8/1973 Kronies et al. .................. 307/470
4,085,341 4/1978 Reinert ........................... 307/247 R
4,182,961 1/1980 Dingwall ......................... 307/289

FOREIGN PATENT DOCUMENTS 231367 7/1984 Japan .............................. 377/47

Primary Examiner—John S. Heyman
Assistant Examiner—K. Ohralik
Attorney, Agent, or Firm—Michael D. Bingham

[57] ABSTRACT

An integrated D flip-flop circuit including a plurality of inverter gates produces an output signal having a frequency that is equal to the frequency of an applied alternating input signal divided by a predetermined divide ratio wherein the improvement comprises an additional inverter gate that has an output connected to a predetermined one of the interconnected inverter gates and is responsive to a divide inhibit signal being applied to an input thereof for changing the divide ratio of the D flip-flop circuit.

3 Claims, 3 Drawing Figures

FLIP-FLOP HAVING DIVIDE INHIBIT CIRCUITRY TO CHANGE DIVIDE RATIO

BACKGROUND OF THE INVENTION

The present invention relates to divider circuits for dividing the frequency of an alternating input signal by a desired divide ratio and, more particularly, to a D flip-flop circuit in which the divide ratio of the flip-flop can be inhibited to pass an applied clock signal therethrough without its repetition rate being altered.

D flip-flops are well known to those skilled in the art and have been used in a myriad of applications. Moreover, D flip-flops have been manufactured utilizing conventional integrated injection logic (I$^2$L) technology comprising logic gates formed by open collector NPN transistors, as understood. A typical application for a I$^2$L D flip-flop is, for instance, as a frequency divider circuit in a counter system wherein the frequency or repetition rate of a fundamental signal is divided down by a fixed divide ratio. Thus, by cascading a number, N, of D flip-flops in a divider chain it is understood that the repetition rate of the fundamental signal will be divided by a ratio equal to $2^N$. Hence, a series of three cascaded D flip-flops will divide the frequency of an applied input clocking signal by 8. One application of a divider chain of the type aforementioned may be found in a digital, crystal controlled function such as a digital watch wherein the frequency of the crystal controlled oscillator is divided by the use of D flip-flops to a one hertz output signal.

Another application for D flip-flop divider chains is found in Electronic Telephone Tone Ringer Integrated Circuits such as the MC34012, a Tone Ringer Circuit manufactured by Motorola, Inc. The MC34012 is fabricated using I$^2$L technology and uses D flip-flops and a tone generator circuit to produce a warbling output tone that simulates the telephone bell ringer found in conventional telephones. The tone generator circuit includes an oscillator and a pair of D flip-flop divider chains which produce high and low frequency tones as well as the tone warble frequency by dividing the frequency of the oscillator signal by a predetermined divide ratio. Hence the oscillator frequency ($F_1$) is divided by a first one of the divider chains to a low frequency warble tone ($F_W$). The warble frequency is then used to enable a second divider chain to produce a second frequency ($F_2$) tone that is lower in frequency than $F_1$. The tone ringer signal is produced by supplying the $F_1$ and $F_2$ tones at a modulated $F_W$ rate to an amplifier circuit which in turn drives a piezo transducer, as is understood.

Although divider chains of the above described type function quite well to divide an input frequency by a fixed divide ratio, it may be desired to alter the divide ratio without altering the number of flip-flop circuits used. Hence, for instance, it may be desired to allow the user of a tone ringer integrated circuit to vary the frequency of the oscillator externally to the integrated circuit. If, for example, the oscillator frequency is doubled, it may be necessary to double the frequency divide ratio of one or more of the flip-flops in the internal divider chain of the integrated circuit. Presently, there is no way to alter the divide ratio of internal flip-flop circuits of such tone ringer circuits as the MC34012 without making mask changes during the fabrication of the I$^2$L flip-flop circuitry.

Thus, a need exists for a D flip-flop circuit that is suitable for fabrication in integrated circuit form in which the divide ratio thereof can be altered after fabrication.

SUMMARY OF THE INVENTION

Accordingly, it is an object of the present invention to provide an improved D flip-flop.

It is another object of the present invention to provide a D flip-flop in which the divide ratio factor thereof can be inhibited.

Still another object of the present invention is to provide an improved I$^2$L compatible frequency dividing flip-flop wherein the divide ratio can be inhibited.

A further object of the present invention is to provide an improved divider chain utilizing D flip-flop circuits of which the divide ratio can be inhibited for altering the divide ratio of the divider chain.

In accordance with the above and other objects, there is provided a D flip-flop including a plurality of interconnected inverter gates at least two of which form an output latch pair to produce a pair of complimentary output signals, the D flip-flop dividing an input alternating signal applied at the input thereof by a predetermined divide ratio, wherein the improvement comprises a divide inhibit inverter gate having an output connected to the input of a respective one of the inverter gates of the output latch pair and further having an input, the input of the divide inhibit inverter gate being responsive to an applied divide inhibit input signal for changing the divide ratio of the D flip-flop.

DETAILED DESCRIPTION OF THE PREFERRED EMBODIMENTS

Figure 1:
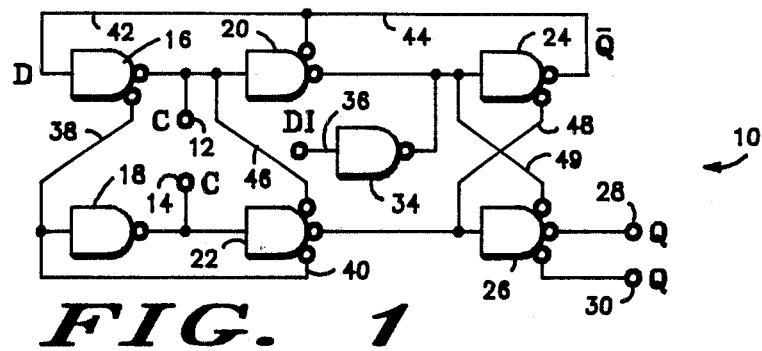
FIG. 1 is a logic schematic illustrating the D flip-flop of the preferred embodiment.
Figure 2:
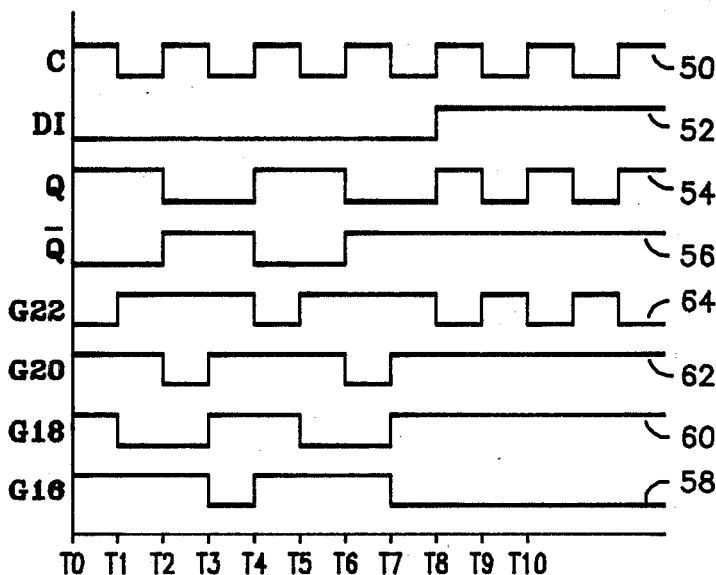
FIG. 2 are timing waveforms useful for understanding the operation of the D flip-flop of FIG. 1.

Turning to FIGS. 1 and 2, the structure and operation of D flip-flop 10 of the present invention is described. It is understood that D flip-flop 10 is suited to be fabricated in monolithic integrated circuit form and can be made compatible with integrated injection logic (I$^2$L) technology. If fabricated using I$^2$L technology, each inverter gate described hereinafter will be comprised of an open collector or multi-open collector NPN transistor having a base which is both coupled to an injection current source and to the input of the logic gate as is understood. Further, the emitter of the open collector transistor would be coupled to a ground reference rail of the integrated circuit.

D flip-flop 10 is illustrated as including a pair of clock input terminals 12 and 14 at which an alternating clock signal 50 (FIG. 2) is applied. The clock signal applied to inputs 12 and 14 is coupled respectively at the outputs of inverter gates 16 and 18 and to the inputs of inverter gates 20 and 22. The outputs of inverter gates 20 and 22 are connected respectively to the inputs of inverter gates 24 and 26. Inverter gates 24 and 26 form a latch output pair at which output signals are produced at output terminals 28 and 30. A divide inhibit inverter gate 34 is provided that has an input and an output, the input being adapted to receive an applied divide inhibit input signal and the output being connected to the input of inverter gate 24 of the latch output pair. As will be explained, the incorporation of divide inhibit gate 34 permits the divide ratio of D flip-flop 10 to be altered either externally to the integrated circuit or internally thereto by use of bonding wires.

The output of inverter gate 16 is connected via lead 38 to the input of inverter gate 18 which is also connected to the output of inverter gate 22 via lead 40. The outputs of inverter gates 20 and 24 are connected to the input of inverter gate 16 via leads 42 and 44 respectively. The output of inverter gate 22 is also connected to the input of inverter gate 20 via lead 46. Inverter gates 24 and 26 function as a latch pair by having their respective outputs cross-coupled to the inputs via leads 48 and 49. The portion of D flip-flop 10 comprising interconnected inverter gates 16, 18, 20, 22, 24 and 26 is conventional and known to those skilled in the art.

In operation, each inverter gate will invert the phase of the applied input signal thereto, i.e., a logic "0" signal applied to an input of an inverter gate produces a logic "1" state at the output. Likewise, a logic "1" signal applied to the input of an inverter gate produces a logic "0" state at the output. Moreover, as understood, each inverter gate is disabled by a logic "0" input signal so that the output will not be toggled by any additional logic input signal as long as the logic "0" or low input signal is applied to the input thereof. Assuming now that a logic "0" or low input signal is applied to the DI input 36 of inverter gate 34 (waveform 52 of FIG. 2), and prior to $T_0$, the outputs (waveforms 54 and 56) of inverter gates 26 and 24 are low and high respectively, the operation of D flip-flop 10 will now be described.

Prior to $T_0$ it is also assumed that the clock signal, waveform 50, is in a low state which will force the output of inverter gate 22 to be in a high output state which in turn forces the output of inverter gate 26 to be in a low or logic "0" output state. The output of inverter gate 26 being in a low output state forces the output of inverter gate 24 of the latch pair to go to a high output state which is as assumed above. The outputs of inverter gates 24 and 20 being in a high output state drive the output of inverter gate 16 low. Thus, the output of inverter gate 18 is in a high output state. In this condition, when the clock signal transitions from a low state to a logic one or high output inverter gates 20 and 24 are connected to the input of inverter gate 16 via leads 42 and 44 respectively. The output of inverter gate 22 is also connected to the input of inverter gate 20 via lead 46. Inverter gates 24 and 26 function as a latch pair by having their respective outputs cross-coupled to the inputs via leads 48 and 49. The portion of D flip-flop 10 comprising interconnected inverter gates 16, 18, 20, 22, 24 and 26 is conventional and known to those skilled in the art.

In operation, each inverter gate will invert the phase of the applied input signal thereto, i.e., a logic "0" signal applied to an input of an inverter gate produces a logic "1" state at the output. Likewise, a logic "1" signal applied to the input of an inverter gate produces a logic "0" state at the output. Moreover, as understood, each inverter gate is disabled by a logic "0" input signal so that the output will not be toggled by any additional logic input signal as long as the logic "0" or low input signal is applied to the input thereof. Assuming now that a logic "0" or low input signal is applied to the DI input 36 of inverter gate 34 (waveform 52 of FIG. 2), and prior to $T_0$, the outputs (waveforms 54 and 56) of inverter gates 26 and 24 are low and high respectively, the operation of D flip-flop 10 will now be described.

Prior to $T_0$ it is also assumed that the clock signal, waveform 50, is in a low state which will force the output of inverter gate 22 to be in a high output state which in turn forces the output of inverter gate 26 to be in a low or logic "0" output state. The output of inverter gate 26 being in a low output state forces the output of inverter gate 24 of the latch pair to go to a high output state which is as assumed above. The outputs of inverter gates 24 and 20 being in a high output state drive the output of inverter gate 16 low. Thus, the output of inverter gate 18 is in a high output state. In this condition, when the clock signal transitions from a low state to a logic one or high output state at $T_0$ the output of inverter gate 22 will go to a low output state which forces the output of inverter gate 26 to a high output state while simultaneously forcing the output of inverter gate 20 to remain high. When the output of inverter gate 26 goes to a high output state, the output of inverter gate 24 is enabled and therefore goes to a low output state which causes the output at invertor gate 16 to be toggled to a high output state. However, a low output state appearing at the output of inverter gate 22 will force the output of inverter gate 18 to remain in a high output state.

At $T_1$, the clock signal transitions to a low level which drives the outputs of inverter gates 18 and 22 to a low and high output state respectively while the outputs of all the other gates remain unchanged. At $T_2$ in response to clock signal 50 going to a high state the output states of inverter gates 20, 24 and 26 are toggled. FIG. 2 illustrates the particular toggling of the interconnected inverter gates of D flip-flop 10 in response to the repeated transitions of the clock signal. As illustrated, as long as the DI inhibit input signal to the input of inverter gate 34 remains in a low state the divide ratio of D flip-flop 10 is equal to 2 such that the frequency of the clock signal is divided in half. Thus, for every two cycles of clock signal 50 ($T_0$-$T_4$) one cycle of the output from gates 26 of D flip-flop 10 is generated.

The divide ratio of D flip-flop 10 is varied or altered by applying a DI input signal to the input of inverter gate 34. The alteration of the divide ratio is illustrated by the waveforms shown in FIG. 2 occurring after $T_8$ when DI signal 52 goes high. With the DI input signal in a high state, the output of inverter gate 34 is forced into a low output state which in turn forces and maintains the output (waveform 56) appearing at the output of inverter gate 24 at a high output state. Under this condition, the output of inverter gate 24 is kept in a high state to force the outputs of inverter gate 16, 18 and 20 to remain unchanged and in a low, and high output states respectively such that clock signal 50 passes through inverter gates 22 and 26 to appear at the Q output terminals 28 and 30 unaffected since only these two inverter gates are allowed to be toggled. In this condition the repetition rate of clock signal 50 is maintained. Therefore, as described above, the frequency or repetition rate of the applied clock signal passes unaffected through D flip-flop 10 as long as a DI input signal is applied to the input 36 of the flip-flop. This corresponds to a divide ratio of one. By grounding input 36 or forcing the DI input signal to a logic 0, D flip-flop divides the frequency of the applied clock signal in half; this corresponds to a divide ratio of two.

Figure 3:
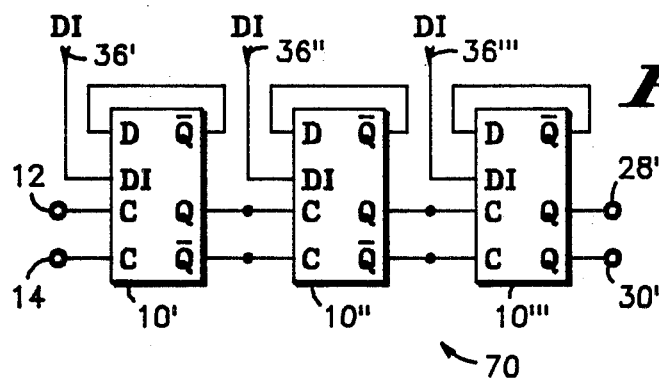
FIG. 3 is a block diagram of a divider chain comprising multiple cascaded D flip-flops of the preferred embodiment.

Turning to FIG. 3 there is shown a divider chain 70 utilizing a multiple number of cascaded D flip-flop 10 of the preferred embodiment. As shown, divider chains 70 includes three D flip-flops each identical to D flip-flop 10 and designated by reference numerals 10', 10" and 10'''. It is understood that any number, N of multiple cascaded D flip-flops of the type illustrated in FIG. 1 will produce a divide ratio equal to $2^N$. In FIG. 3, by connecting DI inputs 36', 36" and 36''' to a low logic state, the clock signal applied to inputs 12 and 14 is divided by 8 ($2^3$) and appears at Q outputs 28' and 30'. By selectively applying a high logic signal to DI inputs 36', 36", and/or 36''', prime divider chain 70 can be programmed to be either a divide by two, four or eight divider as well as a unity divider chain as desired.

Hence, what has been described above, is a novel integrated D flip-flop circuit having a divide input circuit wherein the divide ratio of the D flip-flop can be changed or altered by grounding a divide inhibit DI input externally to the integrated circuit or internally using wire bonding techniques. By connecting the DI input to a low input, N such D flip-flops cascaded together in a divider chain can be programmed to divide the frequency of an input signal by a predetermined divide ratio.

We claim:

1. A D-type flip-flop for dividing the repetition rate of applied clock pulses by a predetermined divide ratio that is alterable, the flip-flop including a plurality of interconnected inverter gates responsive to the clock pulses for providing output pulses at first and second outputs and an output latch circuit coupled between the first and second outputs and an input of the interconnected inverter gates for providing output pulses therefrom that occur at an repetition rate equal to the repetition rate of the clock pulses divided by a first divide ratio the value of which is greater than unity, the improvement comprising a divide inhibit inverter gate having an divide inhibit input to which is supplied an inhibit signal and an output coupled to the latch circuit, said divide inhibit inverter gate being responsive to said inhibit signal for inhibiting the operation of the latch circuit such that said output pulses therefrom occur at the repetition rate of the clock pulses which corresponds to a second divide ratio of unity.

2. A divider chain comprising at least two of the D flip-flops of claim 1 cascaded together for dividing the frequency of an applied input signal at the output thereof by the predetermined divide ratio, said divide ratio being selectively altered in response to divide inhibit signals being applied at said divide inhibit input of each one of said D flip-flop comprising said divider chain.

3. The D flip-flop of claim 1 wherein the plurality of inverter gates and said divide inhibit inverter gate are fabricated in integrated circuit form.

* * * * *